(12) United States Patent
Zhang et al.

(10) Patent No.: US 12,052,000 B2
(45) Date of Patent: Jul. 30, 2024

(54) AMPLIFIER HAVING DISTRIBUTED DIFFERENTIAL POSITIVE FEEDBACK

(71) Applicant: GlobalFoundries U.S. Inc., Malta, NY (US)

(72) Inventors: Mingming Zhang, Beijing (CN); Xu Zhang, Beijing (CN); Hanqing Zhao, Beijing (CN); Lukun Zhai, Beijing (CN); Dan Liu, Beijing (CN); Xuan Li, Beijing (CN)

(73) Assignee: GlobalFoundries U.S. Inc., Malta, NY (US)

( * ) Notice: Subject to any disclaimer, the term of this patent is extended or adjusted under 35 U.S.C. 154(b) by 476 days.

(21) Appl. No.: 17/401,553

(22) Filed: Aug. 13, 2021

(65) Prior Publication Data

US 2023/0053023 A1 Feb. 16, 2023

(51) Int. Cl.
*H03F 1/42* (2006.01)
*H03F 3/45* (2006.01)

(52) U.S. Cl.
CPC ........... *H03F 1/42* (2013.01); *H03F 3/45475* (2013.01); *H03F 2200/36* (2013.01)

(58) Field of Classification Search
CPC ............................. H03F 1/42; H03F 3/45475
See application file for complete search history.

(56) References Cited

U.S. PATENT DOCUMENTS

| | | | |
|---|---|---|---|
| 7,605,660 B1 | 10/2009 | Kobayashi | |
| 7,636,003 B2 | 12/2009 | Liu et al. | |
| 8,456,240 B2 | 6/2013 | Doany et al. | |
| 8,593,207 B2 | 11/2013 | Liu et al. | |
| 8,729,452 B2 | 5/2014 | Tatsumi | |
| 10,505,509 B2 | 12/2019 | Lakshmikumar et al. | |
| 10,566,958 B1* | 2/2020 | Song | G06F 1/10 |
| 11,454,856 B2* | 9/2022 | Appel | G02F 1/225 |
| 2005/0242842 A1* | 11/2005 | Meltzer | H03K 3/356043 326/115 |
| 2005/0281563 A1* | 12/2005 | Li | H04B 10/6932 398/195 |
| 2008/0030266 A1* | 2/2008 | Liu | H03F 3/45179 330/9 |

(Continued)

OTHER PUBLICATIONS

Chan et al., "Inductor-less Bandwidth-Extension Technique Applied to CMOS Differential Trans-impedance Amplifier", IEEE, 2014, pp. 1897-1900.

(Continued)

*Primary Examiner* — Patricia T Nguyen
(74) *Attorney, Agent, or Firm* — David Cain; Hoffman Warnick LLC

(57) ABSTRACT

Amplifier devices includes a first amplifier connected to receive an input voltage. The first amplifier outputs an internal voltage. These structures also include a second amplifier having an input node connected to receive the internal voltage and an output node outputting an output voltage. A resistive feedback loop is connected to the input node and the output node of the second amplifier. A first cross-coupled bandwidth boosting stage is connected to the input node of the second amplifier and a second cross-coupled bandwidth boosting stage connected to the output node of the second amplifier. The cross-coupled bandwidth boosting stages form a distributed differential positive feedback structure.

20 Claims, 6 Drawing Sheets

(56) References Cited

U.S. PATENT DOCUMENTS

| | | | | |
|---|---|---|---|---|
| 2009/0243718 A1* | 10/2009 | Bonthron | ............... | H03F 3/607 |
| | | | | 330/10 |
| 2009/0245813 A1* | 10/2009 | Bonthron | ............... | G02F 1/225 |
| | | | | 398/188 |
| 2012/0217381 A1 | 8/2012 | Tatsumi | | |
| 2014/0185661 A1* | 7/2014 | Chang | ............... | H04B 1/16 |
| | | | | 375/232 |
| 2017/0117860 A1* | 4/2017 | Itabashi | ............... | H03F 1/48 |
| 2020/0382087 A1 | 12/2020 | Woo et al. | | |

OTHER PUBLICATIONS

Ghasemi et al., "Combination of Inductive Feedback and Shunt Peaking (IF+SHP) for Bandwidth Extension of Transimpedance Amplifiers", IEEE, 2015, pp. 145-148.

Hou et al., "A 23-mW 30-GB/s Digitally Programmable Limiting Amplifier for 100GbE Optical Receivers", IEEE Radio Frequency Integrated Circuits Symposium, 2014, pp. 279-282.

Manfredini et al., "Ultra-Low-Voltage Inverter-Based Amplifier with Novel Common-Mode Stabilization Loop", MDPI Electronics, 9, 1019, 2020, pp. 1-14.

Nauta, Bram, "A CMOS Transconductance-C Filter Technique for Very High Frequencies", IEEE Journal of Solid-State Circuits, vol. 27, No. 2, 1992, 142-153.

Ni et al., "Inductorless Bandwidth Extension Using Local Positive Feedback in Inverter-Based TIAs", IEEE 28th Symposium on Circuits and Systems (MWSCAS), pp. 1-4.

Shopov, Stefan, "A 3×60 Gb/s Transmitter/Repeater Front-End With 4.3 VPP Single-Ended Output Swing in a 28nm UTBB FD-SOI Technology", IEEE Journal of Solid-State Circuits, vol. 51, No. 7, 2016, pp. 1651-1662.

Aminfar et al., "Dynamic Damping in Transimpedance Amplifiers," Conference Paper dated Oct. 2020, Electrical and Computer Engineering, retrieved from: https://www.researchgate.net/publication/349293055 on Aug. 1, 2023, 6 pages.

* cited by examiner

AMPLIFIER HAVING DISTRIBUTED DIFFERENTIAL POSITIVE FEEDBACK

BACKGROUND

Field of the Invention

The present disclosure relates to amplifiers, and more specifically, to devices that use amplifiers used with optical receivers.

Description of Related Art

Optical receivers are often used to transmit data using pulses of light. In optical receivers, a transimpedance amplifier (TIA) receives current from a photodiode and outputs an initial voltage. TIAs tend to have large gain and bandwidth requirements in the system. In view of this, some traditional amplifiers, such as Cherry-Hooper amplifiers, are often used in high-speed designs, where there is a trade-off between bandwidth and gain. Therefore, a bandwidth boosting device is sometimes used with some amplifiers. Such bandwidth boosting devices may consume a substantial area of the circuitry (have a large footprint) or may only provide a limited bandwidth extension.

SUMMARY

Some amplifier devices herein include a first amplifier connected to receive an input voltage. The first amplifier outputs an internal voltage. These structures also include a second amplifier having an input node connected to receive the internal voltage and an output node outputting an output voltage. A resistive feedback loop is connected to the input node and the output node of the second amplifier. A first cross-coupled bandwidth boosting stage is connected to the input node of the second amplifier and a second cross-coupled bandwidth boosting stage connected to the output node of the second amplifier. The cross-coupled bandwidth boosting stages form a distributed differential positive feedback structure.

Other amplifier devices herein include positive and negative voltage input ports. First inverting amplifiers have first inputs connected to the positive and negative voltage input ports. The first inverting amplifiers have first outputs connected to internal positive and negative voltage nodes. Second inverting amplifiers have second inputs connected to the internal positive and negative voltage nodes. The second inverting amplifiers have second outputs connected to positive and negative voltage output ports. Also, resistive feedback loops are connected to the second inputs and the second outputs of the second inverting amplifiers. First cross-coupled inverting amplifiers are connected to the second inputs of the second inverting amplifiers. Second cross-coupled inverting amplifiers are connected to the second outputs of the second inverting amplifiers.

Some optical receivers herein include a photodiode outputting a current. A transimpedance amplifier is connected to receive the current and output an initial voltage. These structures also include a bandwidth boosting device having at least one boosting stage. Each boosting stage includes a first amplifier connected to receive an input voltage (the first amplifier outputs an internal voltage), a second amplifier having an input node connected to receive the internal voltage and an output node outputting an output voltage, a resistive feedback loop connected to the input node and the output node of the second amplifier, a first cross-coupled bandwidth boosting stage connected to the input node of the second amplifier, and a second cross-coupled bandwidth boosting stage connected to the output node of the second amplifier.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, a bandwidth boosting device is sometimes used with optical receiver amplifiers. Such bandwidth boosting devices may consume a substantial area of the circuitry (have a large footprint) or may only provide a limited bandwidth extension. In view of these issues, the devices disclosed below use cross-coupled bandwidth boosting stages to provide a distributed differential positive feedback structure that provides bandwidth extension and high gain. Further, the distributed differential positive feedback structure described herein has a small footprint and lower layers, making its implementation easy.

Figure 1A:
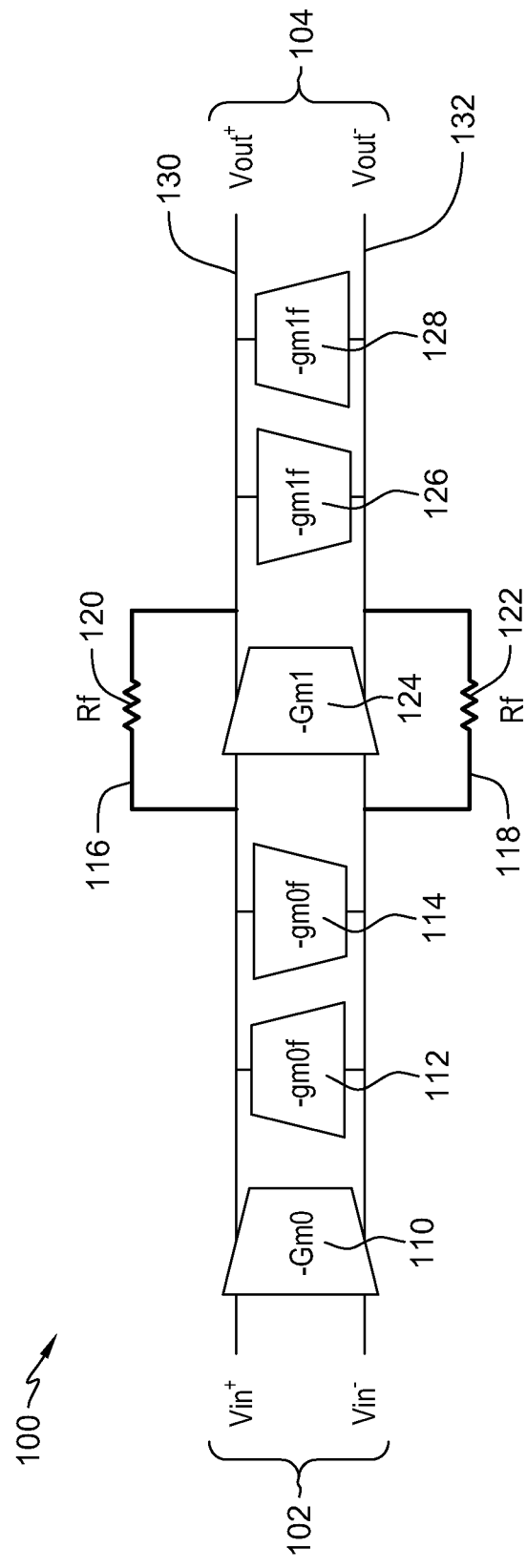
FIGS. 1A-1B are schematic diagrams illustrating an amplifier device according to embodiments herein.

FIG. 1A illustrates one exemplary embodiment of an amplifier device or stage 100 herein used as part of a bandwidth boosting device. The internal components within each of the amplifier devices and components discussed below can be formed from any currently known (or future developed) amplifier elements including field effect transistor (FET)-based amplifier devices, bipolar junction transistor (BJT)-based amplifier devices, etc., and such devices can be based in any technology form such as complementary metal oxide semiconductor (CMOS) or other semiconductor technologies.

Among other components, the multi-amplifier device 100 shown in FIG. 1A includes a first amplifier 110 (e.g., transconductance inverter amplifier) receiving an input voltage 102 and outputting an internal voltage along positive voltage lines/nodes 130 and negative voltage lines/nodes 132. These structures also include a second amplifier 124 (e.g., transconductance inverter amplifier) having an input node (located where the input of the second amplifier 124 intersects the positive voltage lines/nodes 130 and the negative voltage lines/nodes 132) receiving the internal voltage and an output node (located where the output of the second amplifier 124 intersects the positive voltage lines/nodes 130 and the negative voltage lines/nodes 132) providing output that is provided at an output voltage node 104. One or more resistive feedback loops 116, 118, each having some controllable resistance (e.g., resistors 120, 122, resistive wire, etc.) are connected to provide feedback from the output node to the input node of the second amplifier 124.

A first cross-coupled bandwidth boosting stage 112, 114 can be connected to the input node of the second amplifier 124. These structures can also include a second cross-coupled bandwidth boosting stage 126, 128 connected to the output node of the second amplifier 124. The first cross-coupled bandwidth boosting stage 112, 114 and the second cross-coupled bandwidth boosting stage 126, 128 each have amplifier components connected in opposite orientations (e.g., oppositely connected inputs and outputs) relative to voltage nodes of the first amplifier 110 and the second amplifier 124. In some structures herein, the first cross-coupled bandwidth boosting stage 112, 114 and the second cross-coupled bandwidth boosting stage 126, 128 have identical (and identically cross-coupled) amplifier components.

The first amplifier 110, the second amplifier 124, the first cross-coupled bandwidth boosting stage 112, 114, and the second cross-coupled bandwidth boosting stage 126, 128 are connected to the positive voltage lines/nodes 130 and the negative voltage lines/nodes 132. The first amplifier 110 and the second amplifier 124 each have positive input and output nodes connected to the positive voltage lines/nodes 130, and negative input and output nodes connected to the negative voltage lines/nodes 132. In contrast, the first cross-coupled bandwidth boosting stage 112, 114 and the second cross-coupled bandwidth boosting stage 126, 128 have amplifier components connected between the positive voltage lines/nodes 130 and the negative voltage lines/nodes 132.

Figure 1B:
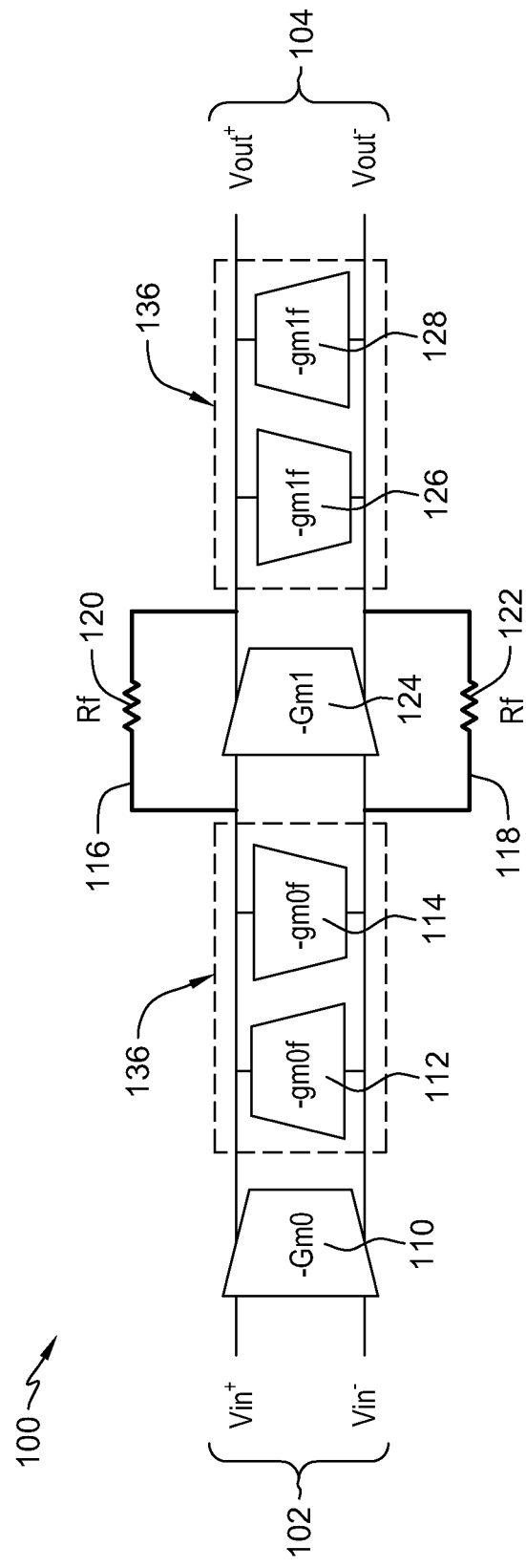

As shown in FIG. 1B, the first cross-coupled bandwidth boosting stage 112, 114 and the second cross-coupled bandwidth boosting stage 126, 128 form a distributed differential positive feedback structure 136 between the positive voltage lines/nodes 130 and the negative voltage lines/nodes 132. As shown in FIGS. 1A-1B, the distributed differential positive feedback structure 136 is connected to the inputs and outputs of the second amplifier 124.

This distributed differential positive feedback structure 136 avoids using peaking inductors as a bandwidth boosting device. The distributed differential positive feedback structure 136 uses amplifiers to provide stronger bandwidth extension with high gain while reducing the device footprint, which makes the structure easier to implement in existing devices. Cross-coupling the amplifiers balances the amplification between the positive and negative nodes. Thus, the multi-amplifier device 100 shown in FIGS. 1A-1B occupies less area and less layers than corresponding inductor-based bandwidth boosting devices. Additionally, the structure shown in FIGS. 1A-1B has a high quality (Q) factor.

Figure 2:
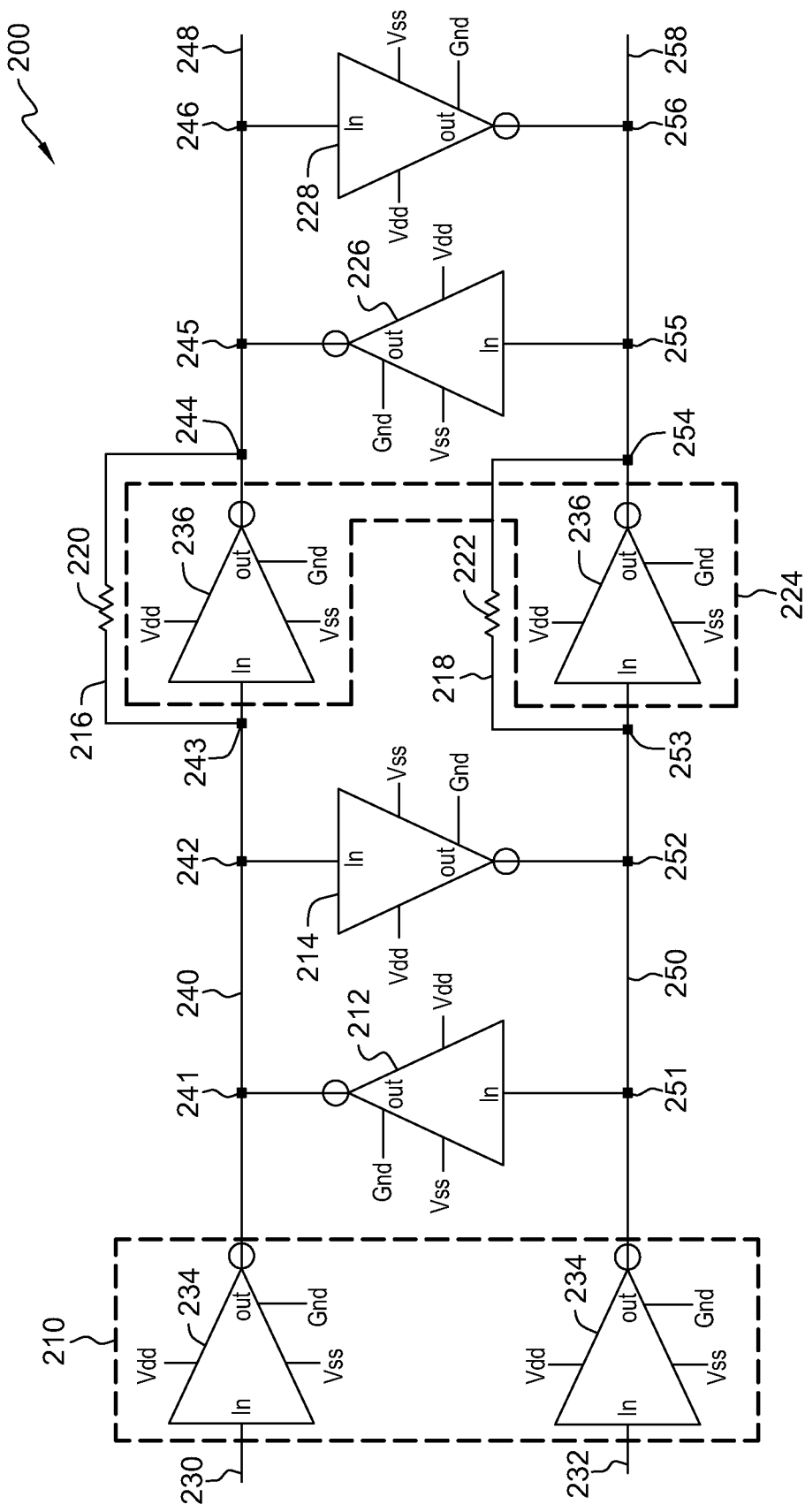
FIG. 2 is a schematic diagram of a specific example of the amplifier device shown in FIGS. 1A-1B.

FIG. 2 is a schematic diagram of a specific example of the amplifier device 200 that is similar to that shown in FIGS. 1A-1B. While the structure shown in FIGS. 1A-1B can use any form of amplifier components, the more specific non-limiting example shown in FIG. 2 uses inverting amplifiers. The structures herein are not restricted to inverting amplifiers and FIG. 2 is only one example of many different ways the concepts shown in FIGS. 1A-1B could be implemented and the claims set forth below are intended to apply to all such possible implementations.

The exemplary amplifier device 200 shown in FIG. 2 includes positive (230) and negative (232) voltage input ports, and positive (240) and negative (250) voltage lines extending to positive (248) and negative (258) output ports. Various nodes (241-246) are along the positive voltage line 240 and various nodes (251-256) are along the negative voltage line 250.

Shown in FIG. 2 are first inverting amplifiers 234 that have first inputs connected to the positive and negative voltage input ports 230, 232. The first inverting amplifiers 234 form a first amplifier device 210 (e.g., transconductance inverter amplifier) that is one example of the first amplifier 110 shown in FIG. 1. The first inverting amplifiers 234 have first outputs connected to internal positive and negative voltage nodes 241, 251. Second inverting amplifiers 236 have second inputs connected to internal positive and negative voltage nodes 243, 253. The second inverting amplifiers 236 form a second amplifier device 224 (e.g., transconductance inverter amplifier) that is one example of the second amplifier device 124 shown in FIG. 1. The second inverting amplifiers 236 have second outputs connected to positive and negative voltage nodes 244, 254 which connect to the positive and negative voltage output ports 248, 258. Also, resistive feedback loops 216, 218 having resistors 220, 222 are connected to the second inputs (at nodes 243, 253) and the second outputs (at nodes 244, 254) of the second inverting amplifiers 236.

FIG. 2 also shows first cross-coupled inverting amplifiers 212, 214 connected to the second inputs of the second inverting amplifiers 236. These first cross-coupled inverting amplifiers 212, 214 correspond to the first cross-coupled bandwidth boosting stage 112, 114 shown in FIGS. 1A-1B. Second cross-coupled inverting amplifiers 226, 228 are connected to the second outputs of the second inverting amplifiers 236. These second cross-coupled inverting amplifiers 226, 228 correspond to the second cross-coupled bandwidth boosting stage 126, 128 shown in FIGS. 1A-1B. The first cross-coupled inverting amplifiers 212, 214 and the second cross-coupled inverting amplifiers 226, 228 can have identical amplifier components.

As shown in FIG. 2, the first cross-coupled inverting amplifiers 212, 214 are identified as being cross-coupled because they are connected inversely relative to one another with respect to the internal positive and negative voltage lines 240, 250 where the output of inverter 212 and input of inverter 214 are connected to positive voltage line 240 (at nodes 241, 242) and the input of inverter 212 and output of inverter 214 are connected to negative voltage line 250 (at nodes 251, 252).

Similarly, the second cross-coupled inverting amplifiers 226, 228 are identified as being cross-coupled because they are connected inversely relative to one another with respect to the internal positive and negative voltage lines 240, 250 where the output of inverter 226 and input of inverter 228 are connected to positive voltage line 240 (at nodes 245, 246) and the input of inverter 226 and output of inverter 228 are connected to negative voltage line 250 (at nodes 255, 256).

The first inverting amplifiers 234 and the second inverting amplifiers 236 each are connected to (have) positive input nodes (230, 243) and output nodes (241, 244) and negative input nodes (232, 253) and output nodes (251, 254) connected to the internal positive and negative voltage nodes/lines 240, 250. However, the first cross-coupled inverting amplifiers 212, 214 and the second cross-coupled inverting amplifiers 226, 228 are connected in opposite orientations relative to the internal positive and negative voltage nodes/lines 240, 250. Specifically, as shown in FIG. 2, the first cross-coupled inverting amplifiers 212, 214 and the second cross-coupled inverting amplifiers 226, 228 have amplifier components connected between the internal positive and negative voltage nodes/lines 240, 250.

As examples of the first and second cross-coupled bandwidth boosting stages (112, 114 and 126, 128) shown in FIGS. 1A-1B, the first and second cross-coupled inverting amplifiers (212 and 214, 226 and 228) form a distributed differential positive feedback structure between the internal positive and negative voltage lines 240, 250. As noted above, use of the first and second cross-coupled inverting amplifiers (212 and 214, 226 and 228) provides stronger bandwidth extension with high gain while reducing the device footprint, especially with respect to corresponding inductor-based bandwidth boosting devices. By using amplifiers for boosting bandwidth, the distributed differential positive feedback structure is independent of processing parameters that can change resistance and the output impedance of the distributed differential positive feedback structure 136 has less impact. Additionally, the structure shown in FIGS. 1A-1B has a high quality (Q) factor.

Specifically, the increase in bandwidth and quality (Q) factor can be seen by looking at the transfer function of the example shown in FIG. 2, which is in the form of a $2^{nd}$-order system:

$$H(s) = \frac{b_0}{a_0 + a_1 s + a_2 s^2}$$

where, $$b_0 = gm_1 R_1 R_2 (-1 + gm_2 R_f)$$

$$a_0 = R_1 + R_2 + gm_2 R_1 R_2 - gm_{f1} R_1 R_2 -$$
$$gm_{f2} R_1 R_2 + R_F - gm_{f1} R_1 R_f - gm_{f2} R_2 R_f + gm_{f1} gm_{f2} R_1 R_2 R_f$$

$$a_1 = C_1 R_1 R_2 + C_2 R_1 R_2 + C_1 R_1 R_f +$$
$$C_2 R_2 R_f - C_2 gm_{f1} R_1 R_2 R_f - C_1 gm_{f2} R_1 R_2 R_f$$

$$a_2 = C_1 C_2 R_1 R_2 R_f$$

In the above transfer function, gm represents a gain circuit element, Rf represents a resistive circuit element, C represents a capacitive circuit element, etc. The above transfer function is a typical form of second-order systems. Solving the denominator provides two conjugate poles in the following form.

$$s_1 = \frac{-a_1 - \sqrt{a_1^2 - 4a_0 a_2}}{2a_2}, s_2 = \frac{-a1 - \sqrt{a_1^2 - 4a_0 a_2}}{2a_2}$$

When gm0f and gm1f increase, a0 and a1 decrease, but a2 remains unchanged, this results in the conjugate poles approaching the imaginary axis, with Q factor increasing and bandwidth increasing. Therefore, the above distributed differential positive feedback structure increases the quality factor (Q) and bandwidth while increasing gain.

Figure 3:
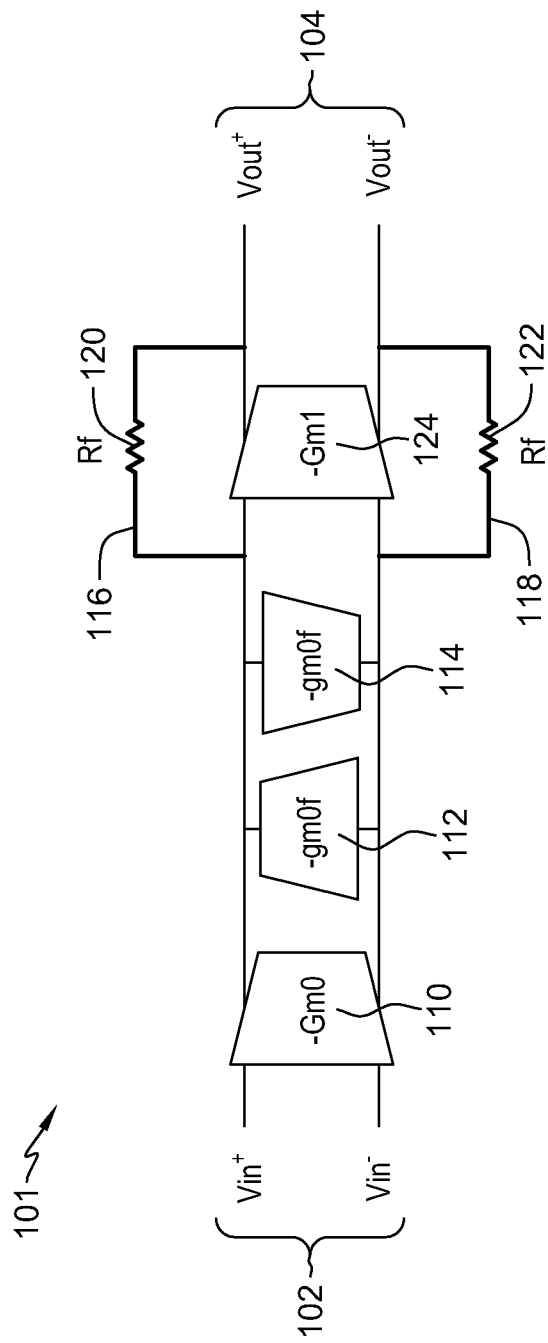
FIGS. 3-4 are schematic diagrams illustrating other amplifier devices according to embodiments herein.

While FIGS. 1A-1B illustrate a structure where the distributed differential positive feedback structure in connected to the inputs and outputs of the second amplifier 124, in situations where the needed bandwidth increases are secondary to considerations of footprint size, production costs, etc., one of the cross-coupled bandwidth boosting stages (112, 114 or 126, 128) can be removed from the amplifier structure 100 shown in FIGS. 1A-1B. Therefore, FIG. 3 illustrates the same structure shown in FIGS. 1A-1B, but with the structure 101 in FIG. 3, the cross-coupled bandwidth boosting stage 126, 128 is not included. Similarly, FIG. 4 illustrates the same structure shown in FIGS. 1A-1B, but with the structure 103 in FIG. 4, the cross-coupled bandwidth boosting stage 112, 114 is not included.

Figure 4:
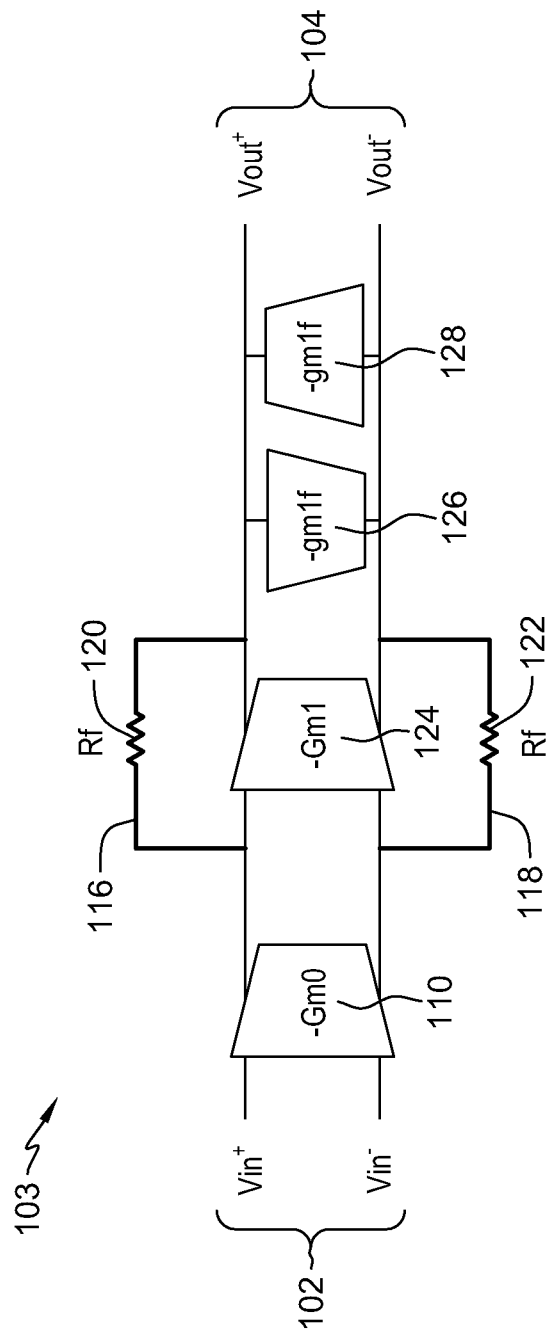

Note that, with the structures shown in FIGS. 3 and 4, the bandwidth increase will not be as large as with the structure shown in FIGS. 1A-2. Specifically, with the structures in FIGS. 3 and 4, the parasitic capacitance will increase (relative to the structure shown in FIGS. 1A-2) in high speed nodes, and the increase in parasitic capacitance will limit the bandwidth increase. Thus, if the distributed differential positive feedback structure, is only used at the input or output of the second amplifier 124, the parasitic capacitance increase may require a larger feedback coefficient for effective bandwidth boosting. Note that the distributed feedback with the structure shown in FIGS. 1A-2 adds less parasitic capacitance, which reduces the impact on the bandwidth and Q factor.

Figure 5:
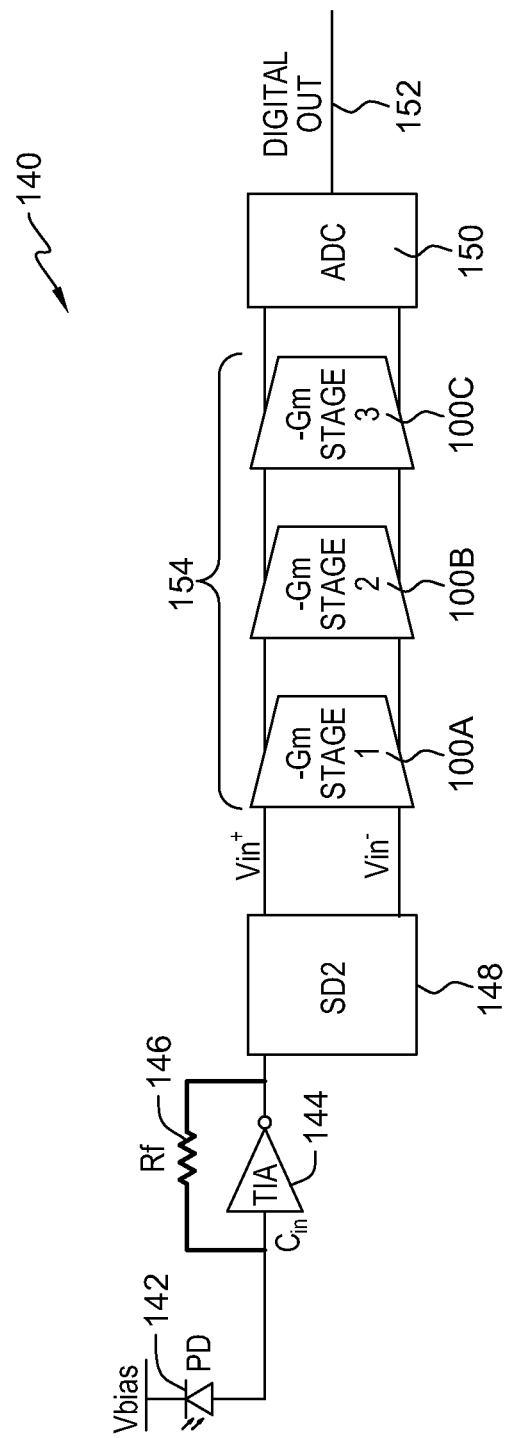
FIG. 5 is a schematic diagram of a receiver using stages having the amplifier device shown in FIGS. 1A-4.

FIG. 5 is a schematic diagram illustrating an example of an optical receiver 140 that uses multiple stages of the above-mentioned amplifier devices. The optical receiver 140 includes some form of an optical receiver, such as a photodiode 142, outputting a current. A transimpedance amplifier (TIA) 144 (having a resistive feedback loop 146) is connected to receive the current from the photodiode 142 and the transimpedance amplifier 144 outputs an initial voltage. A single-ended to differential amplifier device (S2D) 148 converts the initial voltage into positive and negative voltage.

These structures also include a bandwidth boosting device 154 having at least one boosting stage. While any number of stages could be used depending upon implementation, the example shown in FIG. 5 includes three (−Gm) stages (numbered 1-3), which are shown in FIG. 5 as items 100A, 100B, and 100C. Items 100A-100C are any of the amplifier devices shown in FIGS. 1A-4 that are discussed above. An analog-to-digital converter (ADC) 150 receives the bandwidth boosted differential voltage signal output by the last boosting stage 100C. The ADC 150 converts the voltage signal into a digital output signal 152 which is then provided to other communication devices that process the digital signal.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. A reference to an element in the singular is not intended to mean "one and only one" unless specifically stated, but rather "one or more."

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A device comprising:
a Cherry-Hooper amplifier including a first amplifier and a second amplifier connected to the first amplifier; and
a distributed differential positive feedback structure including a first bandwidth boosting stage connected between an output node of the first amplifier and an input node of the second amplifier and a second bandwidth boosting stage connected to an output node of the second amplifier.

2. The device according to claim 1,
wherein the first amplifier is connected to receive an input voltage,
wherein the first amplifier outputs an internal voltage,
wherein the input node of the second amplifier is connected to receive the internal voltage,
wherein the second amplifier outputs an output voltage at the output node,
wherein the Cherry-Hooper amplifier further includes a resistive feedback loop connected to the input node and the output node of the second amplifier,
wherein the first bandwidth boosting stage includes a first cross-coupled bandwidth boosting stage connected to the output node of the first amplifier and to the input node of the second amplifier, and
wherein the second bandwidth boosting stage includes a second cross-coupled bandwidth boosting stage connected to the output node of the second amplifier.

3. The device according to claim 2, wherein the first cross-coupled bandwidth boosting stage and the second cross-coupled bandwidth boosting stage each have amplifier components connected in opposite orientations relative to voltage nodes of the first amplifier and the second amplifier.

4. The device according to claim 2, wherein the first amplifier, the second amplifier, the first cross-coupled bandwidth boosting stage, and the second cross-coupled bandwidth boosting stage are connected to positive voltage nodes and negative voltage nodes.

5. The device according to claim 4, wherein the first cross-coupled bandwidth boosting stage and the second cross-coupled bandwidth boosting stage have amplifier components connected between the positive voltage nodes and the negative voltage nodes.

6. The device according to claim 4, wherein the first cross-coupled bandwidth boosting stage and the second cross-coupled bandwidth boosting stage form a distributed differential positive feedback between the positive voltage nodes and the negative voltage nodes.

7. The device according to claim 4, wherein the first amplifier and the second amplifier each have positive input and output nodes connected to the positive voltage nodes and negative input and output nodes connected to the negative voltage nodes.

8. A device comprising:
positive and negative voltage input ports;
first inverting amplifiers having first inputs connected to the positive and negative voltage input ports, wherein the first inverting amplifiers have first outputs connected to internal positive and negative voltage nodes;
second inverting amplifiers having second inputs connected to the internal positive and negative voltage nodes, wherein the second inverting amplifiers have second outputs connected to positive and negative voltage output ports;
resistive feedback loops connected to the second inputs and the second outputs of the second inverting amplifiers;
first cross-coupled inverting amplifiers connected to the second inputs of the second inverting amplifiers; and
second cross-coupled inverting amplifiers connected to the second outputs of the second inverting amplifiers.

9. The device according to claim 8, wherein at least one of the first inverting amplifiers and the second inverting amplifiers form a Cherry-Hooper amplifier.

10. The device according to claim 8, wherein the first cross-coupled inverting amplifiers and the second cross-coupled inverting amplifiers are connected in opposite orientations relative to the internal positive and negative voltage nodes.

11. The device according to claim 8, wherein the first cross-coupled inverting amplifiers and the second cross-coupled inverting amplifiers have amplifier components connected between the internal positive and negative voltage nodes.

12. The device according to claim 8, wherein the first cross-coupled inverting amplifiers and the second cross-coupled inverting amplifiers form a distributed differential positive feedback between the internal positive and negative voltage nodes.

13. The device according to claim 8, wherein the first inverting amplifiers and the second inverting amplifiers each have positive input and output nodes and negative input and output nodes connected to the internal positive and negative voltage nodes.

14. A device comprising:
a photodiode outputting a current;
a transimpedance amplifier connected to receive the current and outputting an initial voltage; and
a bandwidth boosting device comprising at least one boosting stage, wherein each of the at least one boosting stage comprises:
a first amplifier connected to receive an input voltage, wherein the first amplifier outputs an internal voltage;
a second amplifier having an input node connected to receive the internal voltage, wherein the second amplifier comprises an output node outputting an output voltage;

a resistive feedback loop connected to the input node and the output node of the second amplifier;

a first cross-coupled bandwidth boosting stage connected to the input node of the second amplifier; and a second cross-coupled bandwidth boosting stage connected to the output node of the second amplifier.

15. The device according to claim 14, wherein the first cross-coupled bandwidth boosting stage and the second cross-coupled bandwidth boosting stage each have amplifier components connected in opposite orientations relative to voltage nodes of the first amplifier and the second amplifier.

16. The device according to claim 14, wherein the first amplifier, the second amplifier, the first cross-coupled bandwidth boosting stage, and the second cross-coupled bandwidth boosting stage are connected to positive voltage nodes and negative voltage nodes.

17. The device according to claim 16, wherein the first cross-coupled bandwidth boosting stage and the second cross-coupled bandwidth boosting stage have amplifier components connected between the positive voltage nodes and the negative voltage nodes.

18. The device according to claim 16, wherein the first cross-coupled bandwidth boosting stage and the second cross-coupled bandwidth boosting stage form a distributed differential positive feedback between the positive voltage nodes and the negative voltage nodes.

19. The device according to claim 16, wherein the first amplifier and the second amplifier each have positive input and output nodes connected to the positive voltage nodes and negative input and output nodes connected to the negative voltage nodes.

20. The device according to claim 14, wherein the first cross-coupled bandwidth boosting stage and the second cross-coupled bandwidth boosting stage have identical amplifier components.

* * * * *